(12) United States Patent
Liang (10) Patent No.: US 7,619,892 B2
(45) Date of Patent: Nov. 17, 2009

(54) POSITIONING DEVICE FOR HEATSINK (75) Inventor: Robert Liang, Taoyuan (TW)

(73) Assignee: Malico Inc., Taoyuan Hsien (TW)

( * ) Notice: Subject to any disclaimer, the term of this patent is extended or adjusted under 35 U.S.C. 154(b) by 19 days.

(21) Appl. No.: 12/025,770

(22) Filed: Feb. 5, 2008

(65) Prior Publication Data
US 2009/0195987 A1 Aug. 6, 2009

(51) Int. Cl.
H05K 7/20 (2006.01)
(52) U.S. Cl. .................. 361/707; 361/704; 361/710; 361/719; 165/80.3; 248/505; 248/510
(58) Field of Classification Search ......... 361/702–712, 361/715, 717, 719–722; 165/80.3, 80.4, 165/104.33, 104.34, 185; 174/15.1, 16.3, 174/252, 260; 248/271, 505, 510; 24/453, 24/457, 458, 624
See application file for complete search history.

(56) References Cited

U.S. PATENT DOCUMENTS

| | | | | |
|---|---|---|---|---|
| 5,495,392 | A * | 2/1996 | Shen | 361/697 |
| 5,734,553 | A * | 3/1998 | Hong | 361/697 |
| 6,153,932 | A | 11/2000 | Liang | 257/712 |
| 6,476,484 | B1 | 11/2002 | Liang | 257/718 |
| 6,644,396 | B2 | 11/2003 | Liang | 165/185 |
| 6,728,103 | B1 * | 4/2004 | Smedberg | 361/703 |
| 7,277,288 | B2 * | 10/2007 | Lee et al. | 361/704 |
| 7,307,842 | B1 * | 12/2007 | Liang | 361/710 |
| 7,518,873 | B2 * | 4/2009 | Park et al. | 361/710 |

* cited by examiner

Primary Examiner—Michael V Datskovskiy (57) ABSTRACT

A positioning device for connecting a heatsink to a chip set includes a rectangular frame having a through hole in a center thereof, two side plates extending from two opposite sides thereof and each side plate has one hook extending from an inside thereof. Two positioning rods extend from the other two opposite sides of the rectangular frame, and a plurality of flexible rods extend from insides of the rectangular frame. The heatsink extends through the through hole of the rectangular frame and the positioning rods insert through apertures in the heatsink. The hooks are hooked to two sides of the chip set and the flexible rods press on the heatsink.

2 Claims, 9 Drawing Sheets

POSITIONING DEVICE FOR HEATSINK

BACKGROUND OF THE INVENTION

1. Field of the Invention

The present invention relates generally to a positioning device for connecting a heatsink to a chip set.

2. The Prior Arts

Chip set used on computer generates a lot of heat which should be removed from the chip set to keep the optimal operation of the chip set. A conventional heatsink is connected to the chip set and cooperated with a fan so as to remove the heat from the chip set.

One of the method for connecting the heatsink to the chip set is to clip the heatsink to the socket of the chip set. However, the metallic clip includes complicated structure and tends to reach its fatigue limit quickly. Besides, the chip set can be damaged during processes of installing the clip and the clip might be disengaged from the socket during transportation. Furthermore, if the chip set is directly soldered to the circuit, there will be no place for the clip to position the heatsink.

Generally, there is a gap about 0.25 mm between the chip set and the circuit board and which is so narrow that no one thinks about to use the gap for the heatsink. Some assemblers use heat dispensing tapes to connect the heatsink with the circuit board or directly connect the heatsink to the circuit board by screws. The tapes are easily dry and removed from the surface of the chip set and the screws require holes drilled in the circuit board. There is limited area on the circuit board so that holes cannot be drilled in the desired positions. Therefore, most of the manufacturers for making the circuit boards do not drill holes in the circuit boards.

Some manufacturers develop a positioning device that includes a through hole at the center and four side plates extend from four sides of the device. Each side plate includes a hook on an inside thereof. When the heatsink extends through the through hole from the underside of the device, the hooks are hooked to two sides of the chip set, and the heatsink is securely positioned on the chip set.

However, during installation, the hooks might not hook to the sides of the chip set and the heatsink may not have straight or smooth bottom so that the heatsink does not contact the chip set properly. Therefore, heat from the chip set cannot conduct to the heatsink as desired. There are only two side plates hook to two sides of the chip set and the other two side plates are engaged with two slots defined in the heatsink so as to well position the device to the heatsink. However, the slots reduce the area for removing heat from the chip set.

Figure 9:
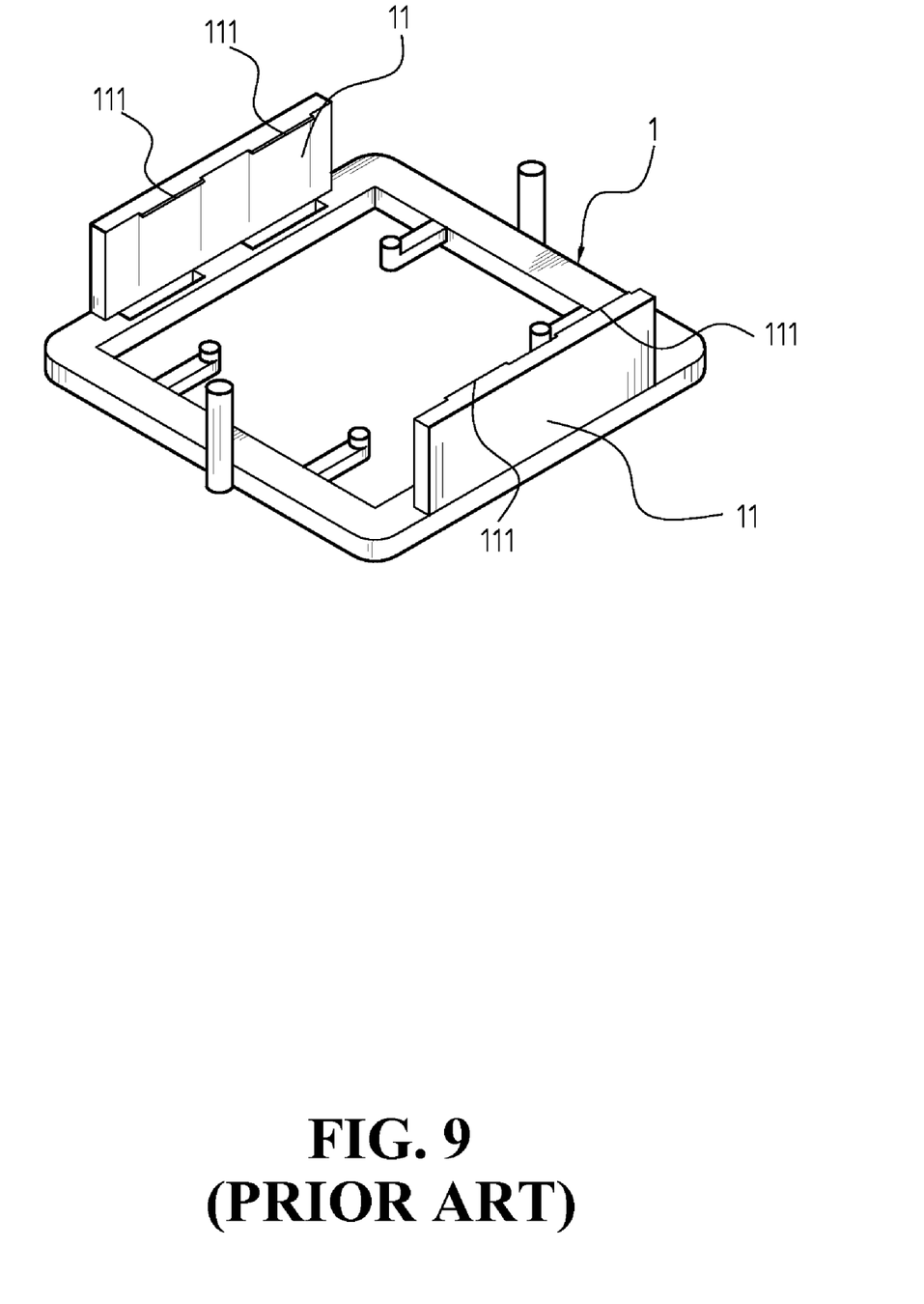
FIG. 9 shows a conventional positioning device.

FIG. 9 shows another conventional positioning device for the heatsink and includes a rectangular frame 11 and two side plates 11 extend from two opposite sides of the frame 11, and each side plate 11 has two hooks 111 on an inside thereof. Two positioning rods extend from the other two opposite sides of the frame 11. A plurality of flexible rods extend from the insides of the frame 11 and each flexible rod has a protrusion on a bottom of a distal end thereof. A plurality of fins of the heatsink extends through the through hole in the center of the frame 11 and hooks on the two side plates hook two sides of the chip set. The positioning rods insert through holes defined through the heatsink, and the protrusions on the flexible rods are rested on the heatsink.

There are four hooks on the two side plates and some of the hooks might not actually hook the chip set, and the hooks that are not actually hook the chip set may interfere with the electronic components on the circuit board.

SUMMARY OF THE INVENTION

The present invention provides a positioning device for positioning a heatsink to the chip set and the positioning device includes two or three hooks on two side plates so as to hook on the chip set firmly.

A main objective of the present invention is to provide a positioning device for connecting a heatsink to a chip set, which can prevent the interference with electronic components on a circuit board and the occurrence of the incomplete engagement of hooks.

According to the present invention, a positioning device for connecting a heatsink to a chip set is provided and comprises a rectangular frame having two side plates extending from two opposite sides of the rectangular frame and each side plate has one hook extending from an inside thereof. Two positioning rods extend from the other two opposite sides of the rectangular frame. A plurality of flexible rods extend from insides of the rectangular frame. Each flexible rod has a protrusion extending downward from a distal end thereof.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
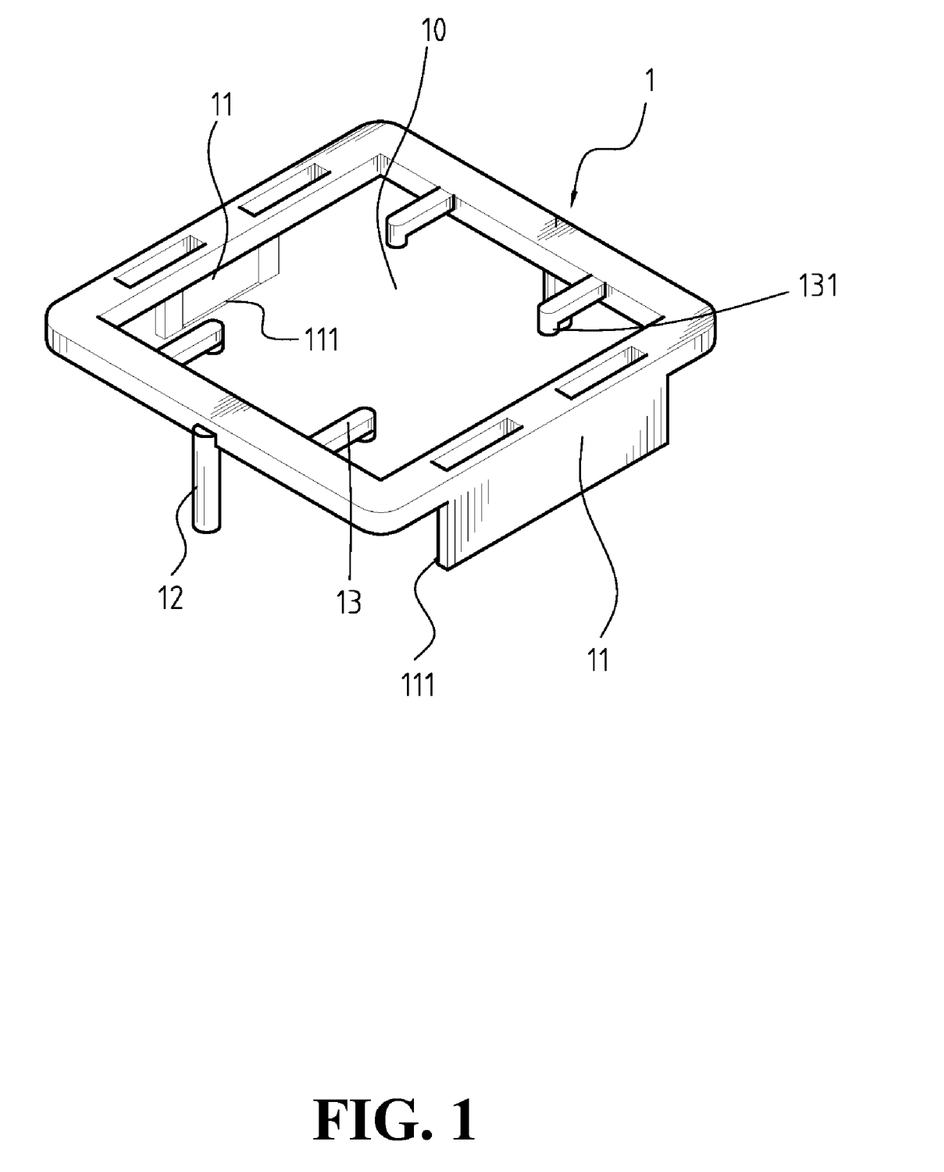
FIG. 1 is a perspective view showing a positioning device in accordance with the present invention.
Figure 2:
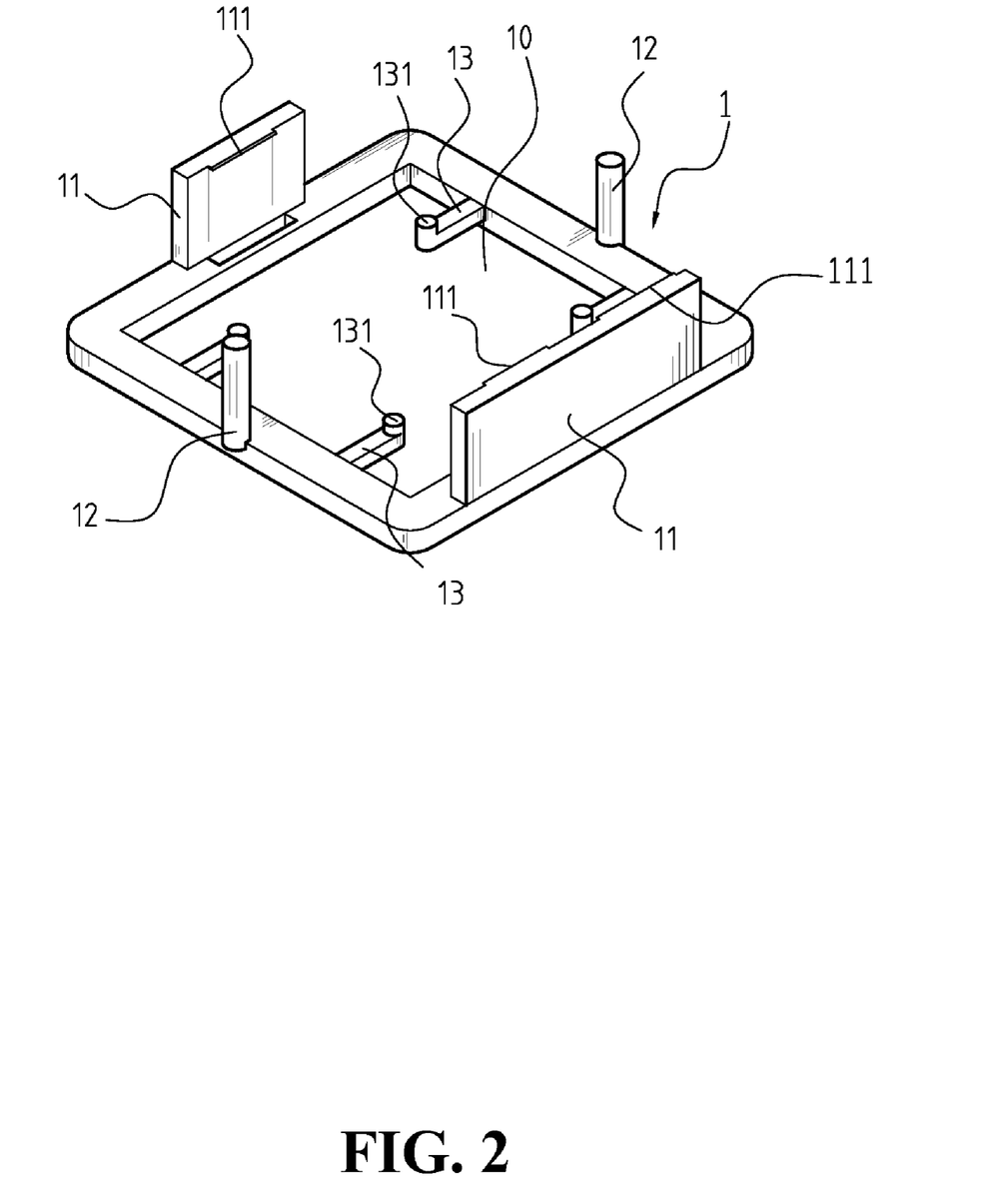
FIG. 2 is a perspective view showing an underside of the positioning device in accordance with the present invention.
Figure 3:
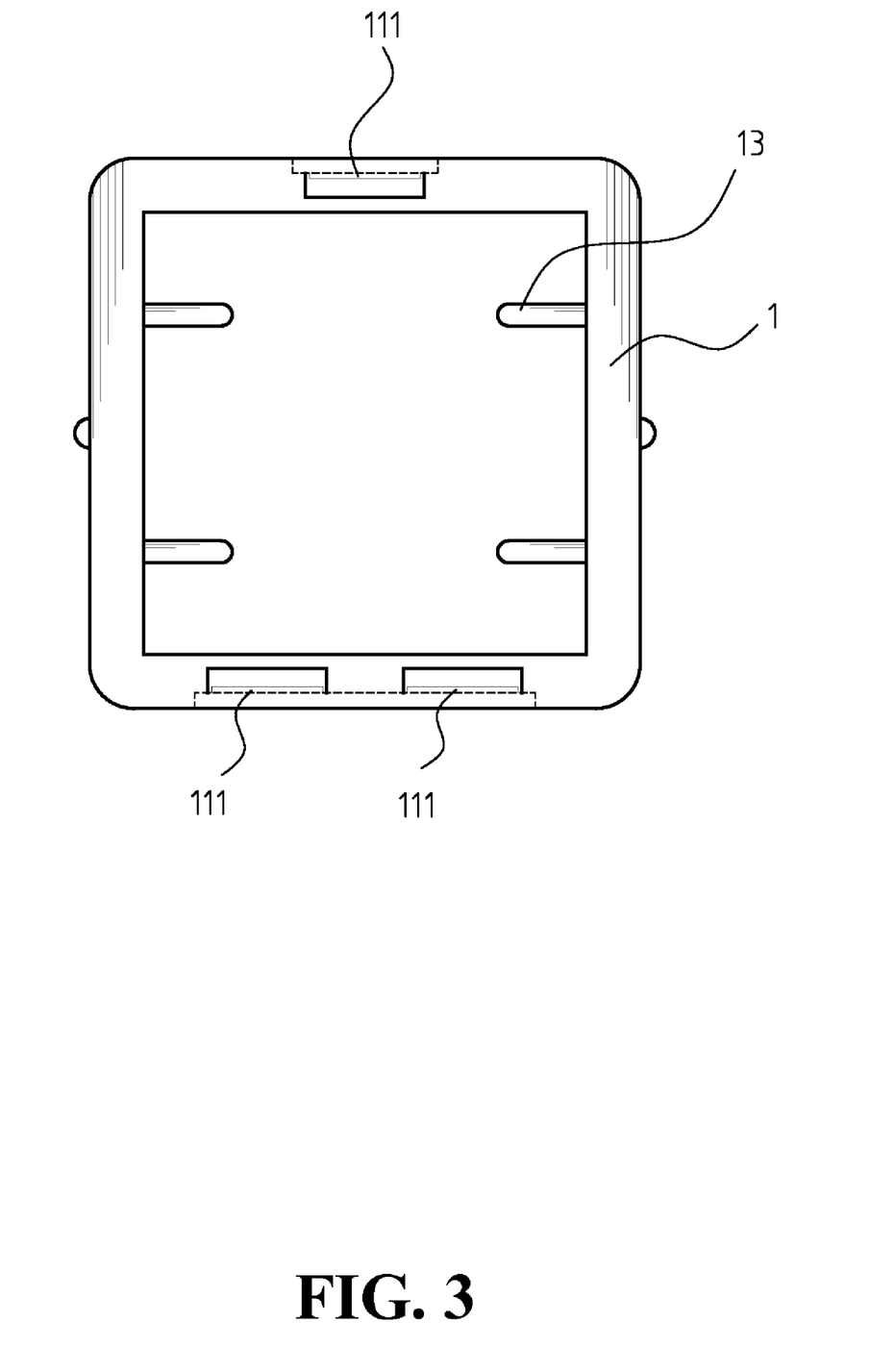
FIG. 3 shows that the three hooks of the positioning device in accordance with the present invention are located at three corners of an isosceles triangle.
Figure 4:
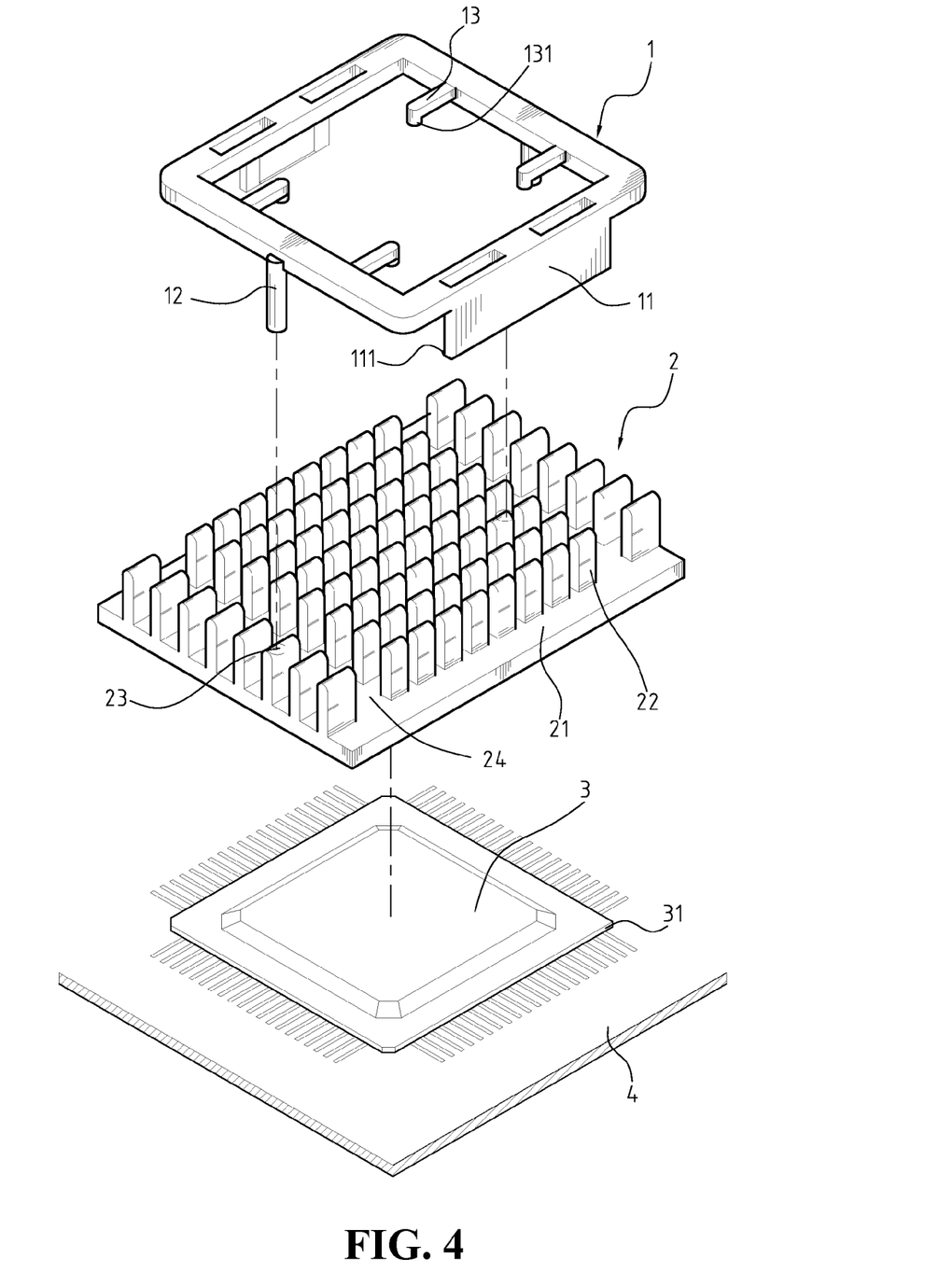
FIG. 4 is an exploded view to show the positioning device in accordance with the present invention, a heatsink and a chip set.

With reference to the drawings and in particular to FIGS. 1 to 3, a positioning device for connecting a heatsink 2 to a chip set 3 (as shown in FIG. 4) comprises a rectangular frame 1 having a through hole 10 defined in a center thereof and two side plates 11 extend from two opposite sides of the rectangular frame 1. One of the two side plates 11 has one hook 111 extending from an inside thereof, and the other side plate 11 has two hooks 111 extending from an inside thereof. The three hooks 111 are located at three corners of an isosceles triangle as disclosed in FIG. 3. Two positioning rods 12 extend from the other two opposite sides of the rectangular frame 1, and the length of the positioning rods 12 is not shorter than the length of the side plates 11. A plurality of flexible rods 13 extend from insides of the two opposite sides which are connected with the positioning rods 12. Each flexible rod 13 has a protrusion 131 extending downward from a distal end thereof.

Figure 5:
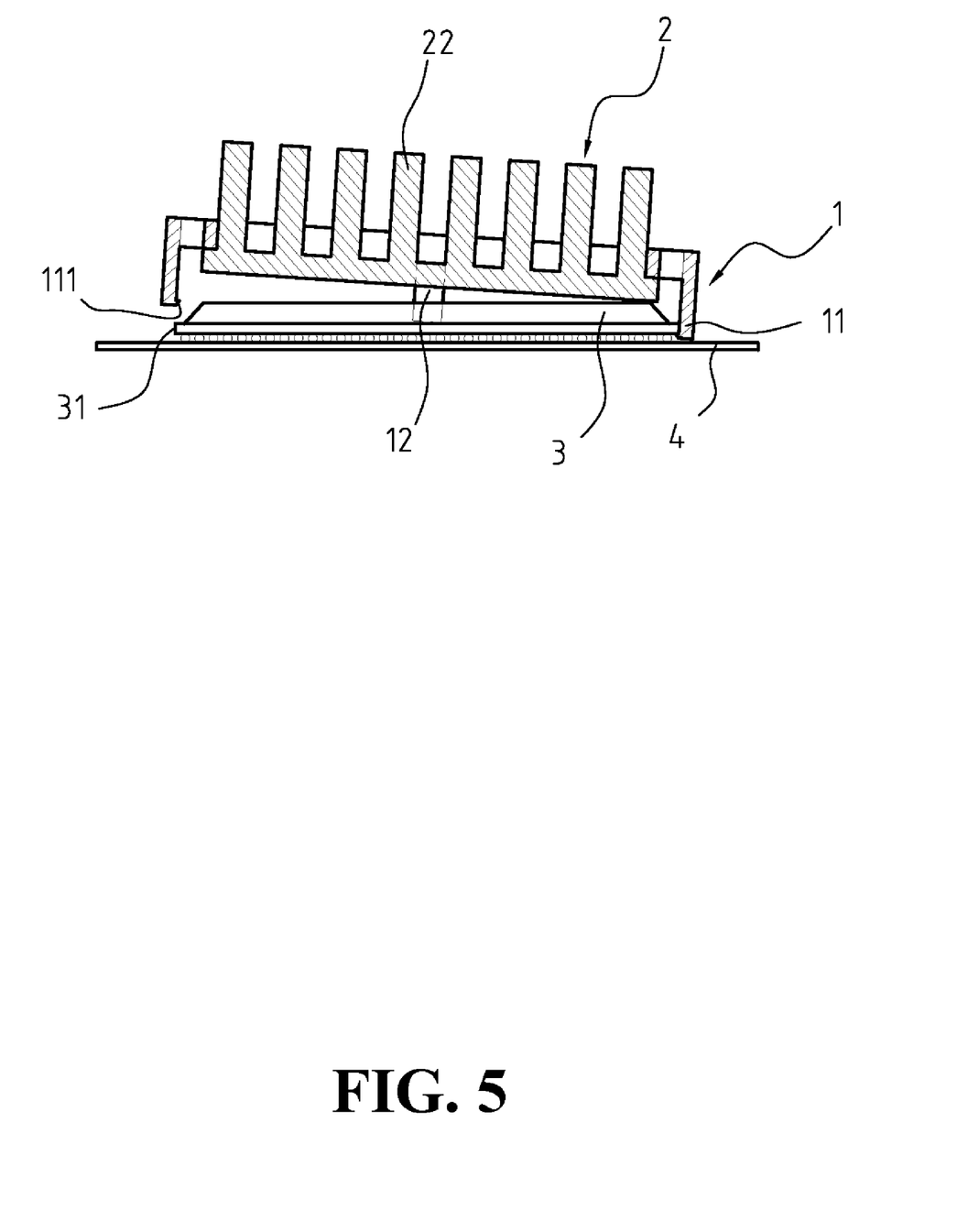
FIG. 5 shows that the positioning device of the present invention hooks on one side of the chip set first and then hooks to the other side of the chip set.
Figure 6:
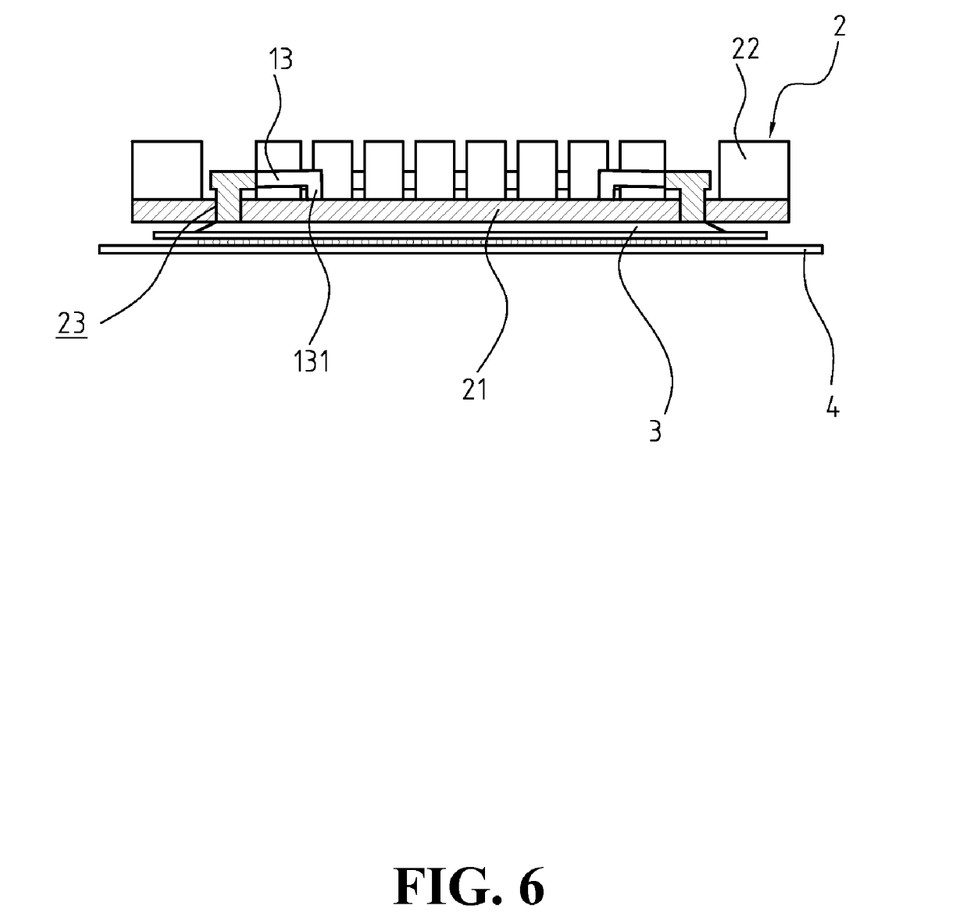
FIG. 6 shows that protrusions of flexible rods of the positioning device of the present invention press on the heatsink.

Referring to FIGS. 4 to 6, the positioning device is mounted onto the heatsink 2. The heatsink 2 includes a base 21 which is larger than the through hole 10 of the rectangular frame 1 and a plurality of fins 22 extending from the base 21. The positioning rods 12 insert through apertures 23 defined through the base 21 of the heatsink 2 and the two sides with the positioning rods 12 of the rectangular frame 1 are engaged with alleys 24 defined between the fins 22. The other two sides with the side plates 11 are located beyond the sides of the base 21 and the hooks 111 on the two side plates 11 hook to two sides 31 of the chip set 3 respectively. It is noted that when pins of the chip set 3 are soldered on the circuit board 4, there will be a gap (about 0.25 mm) defined between the chip set 3 and the circuit board 4 due to the height of the pins. The hooks 111 are then engaged with the gap.

Figure 7:
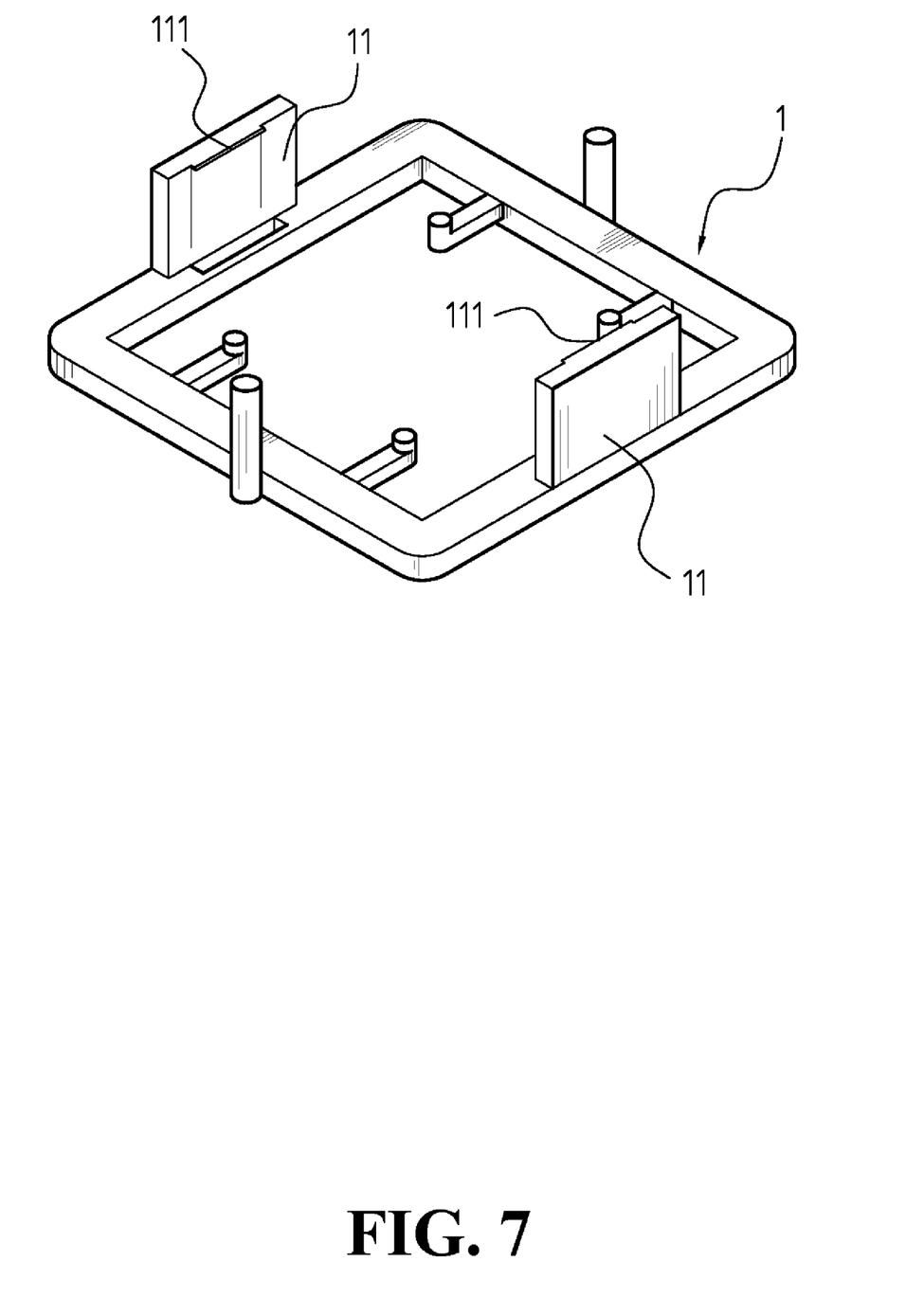
FIG. 7 shows a positioning device in accordance with a second embodiment of the present invention.

FIG. 7 shows a positioning device in accordance with a second embodiment of the present invention, in which there is only one hook 111 on each of the two side plates 111 and the two hooks 111 are located symmetrically to a central axis of the rectangular frame 1.

Figure 8:
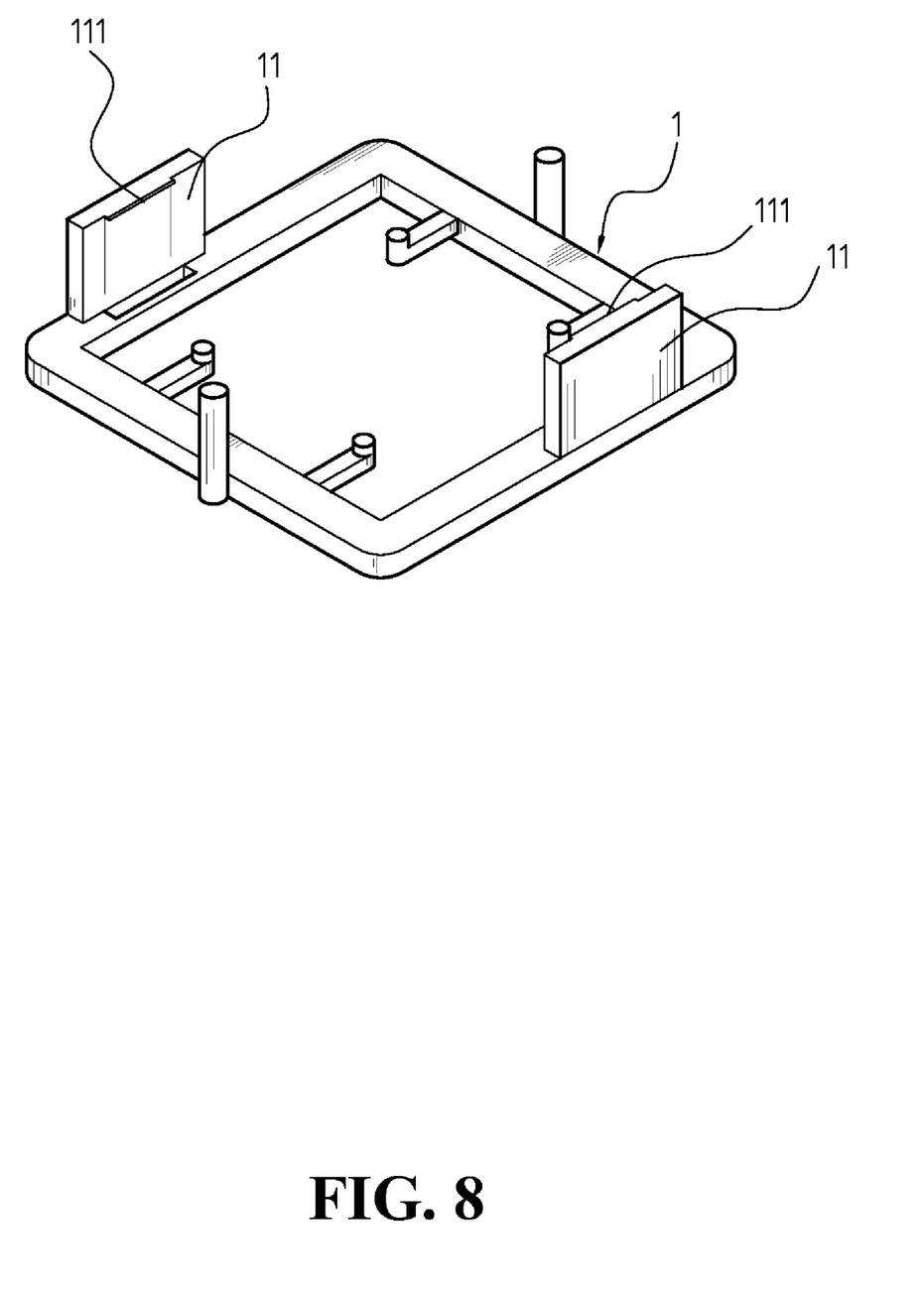
FIG. 8 shows a positioning device in accordance with a third embodiment of the present invention.

FIG. 8 shows a positioning device in accordance with a third embodiment of the present invention, in which there is only one hook 111 on each of the two side plates 111 and the two hooks 111 are located at two ends of a diagonal axis of the rectangular frame 1.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A positioning device for connecting a heatsink to a chip set, comprising:

a rectangular frame having a through hole defined in a center thereof and two side plates extending from two opposite sides of the rectangular frame, each side plate having one hook extending from an inside thereof, two positioning rods extending from the other two opposite sides of the rectangular frame, a plurality of flexible rods extending from insides of the rectangular frame, each flexible rod having a protrusion extending downward from a distal end thereof;

wherein the two hooks are located at two ends of a diagonal axis of the rectangular frame.

2. A positioning device for connecting a heatsink to a chip set, comprising:

a rectangular frame having a through hole defined in a center thereof and two side plates extending from two opposite sides of the rectangular frame, one of the two side plates having one hook extending from an inside thereof and the other side plate having two hooks extending from an inside thereof, the three hooks located at three corners of an isosceles triangle, two positioning rods extending from the other two opposite sides of the rectangular frame, a plurality of flexible rods extending from insides of the rectangular frame, each flexible rods having a protrusion extending downward from a distal end thereof.

\* \* \* \* \*